(12) United States Patent
Burg et al.

(10) Patent No.: US 9,740,175 B2
(45) Date of Patent: Aug. 22, 2017

(54) ALL-DIGITAL PHASE LOCKED LOOP (ADPLL) INCLUDING A DIGITAL-TO-TIME CONVERTER (DTC) AND A SAMPLING TIME-TO-DIGITAL CONVERTER (TDC)

(71) Applicant: Marvell World Trade Ltd., St. Michael (BB)

(72) Inventors: Olivier Burg, Lausanne (CH); Haisong Wang, Crissier (CH); Xiang Gao, Fremont, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 15/370,796

(22) Filed: Dec. 6, 2016

(65) Prior Publication Data
US 2017/0205772 A1 Jul. 20, 2017

Related U.S. Application Data

(60) Provisional application No. 62/279,922, filed on Jan. 18, 2016.

(51) Int. Cl.
| | |
|---|---|
| *H03M 1/50* | (2006.01) |
| *G04F 10/00* | (2006.01) |
| *H03M 1/00* | (2006.01) |
| *H04M 1/50* | (2006.01) |
| *H03M 1/12* | (2006.01) |
| *H03B 21/02* | (2006.01) |
| *H03L 7/089* | (2006.01) |

(52) U.S. Cl.
CPC .......... *G04F 10/005* (2013.01); *H03B 21/02* (2013.01); *H03L 7/0891* (2013.01); *H03M 1/00* (2013.01); *H03M 1/12* (2013.01); *H03M 2201/4233* (2013.01); *H04M 1/505* (2013.01)

(58) Field of Classification Search
CPC .. H03M 2201/4233; H03M 1/00; H03M 1/12; H04M 1/505; H03B 21/02; H03L 7/0891
USPC ........ 341/166, 167, 155, 156; 327/107, 105, 327/156
See application file for complete search history.

(56) References Cited

U.S. PATENT DOCUMENTS

2013/0093471 A1* 4/2013 Cho ................. H03L 7/081
327/107

* cited by examiner

*Primary Examiner* — Joseph Lauture

(57) ABSTRACT

A digital phase locked loop (DPLL) circuit includes a digital-to-time converter (DTC) configured to generate a delayed reference clock signal by delaying a reference clock signal according to a delay control signal and a time-to-digital converter (TDC) coupled to an output of the DTC. The TDC is configured to sample a value of a transition signal according to the delayed reference clock signal and to generate an output signal indicating a phase difference between the delayed clock signal and an input clock signal. A method of controlling a DPLL includes delaying a reference clock signal according to a delay control signal, sampling a value of a transition signal according to the delayed reference clock signal, generating an output signal indicating a phase difference between the delayed clock signal and an input clock signal, and generating a digitally controlled oscillator (DCO) clock signal according to the output signal.

20 Claims, 6 Drawing Sheets

ALL-DIGITAL PHASE LOCKED LOOP (ADPLL) INCLUDING A DIGITAL-TO-TIME CONVERTER (DTC) AND A SAMPLING TIME-TO-DIGITAL CONVERTER (TDC)

CROSS REFERENCE TO RELATED APPLICATION

This present disclosure claims the benefit of U.S. Provisional Application No. 62/279,922 filed on Jan. 18, 2016, which is incorporated by reference herein in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

An all-digital phase locked loop (ADPLL) is a PLL having a digital phase detector, a digital loop filter, and a digitally-controlled oscillator. An ADPLL has beneficial aspects over analog PLLs in view of small circuit area, testability, and programmability. A conventional ADPLL includes a time-to-digital converter (TDC), a frequency divider, and a digitally-controlled oscillator (DCO). When the DCO generates an output clock signal, the frequency divider divides the output clock signal by a predetermined dividing factor, and the TDC measures a phase difference between the divided clock signal and a reference clock signal. A finite resolution of the TDC leads to a quantization error, and thus increases an overall phase noise of the ADPLL.

SUMMARY

In an embodiment, a digital phase locked loop (DPLL) circuit includes a digital-to-time converter (DTC) configured to generate a delayed reference clock signal by delaying a reference clock signal according to a delay control signal and a time-to-digital converter (TDC) coupled to an output of the DTC. The TDC is configured to sample a value of a transition signal according to the delayed reference clock signal and to generate an output signal indicating a phase difference between the delayed clock signal and an input clock signal. The transition signal transitions between a logic high value and a logic low value.

In an embodiment, the DPLL circuit further includes a controller including a delta-sigma modulator, the controller being configured to generate the delay control signal and a divider control signal according to an output sequence from the delta-sigma modulator and a frequency divider configured to divide a frequency of an output clock signal of the DPLL according to the divider control signal to output the input clock signal. The DTC generates the delayed reference clock signal including a first phase error that is substantially the same as a second phase error in the input clock signal, the first phase error and the second phase error being associated with quantization errors of the delta-sigma modulator.

In an embodiment, the TDC includes a slope generation circuit configured to generate the transition signal according to the input clock signal and an analog-to-digital converter (ADC) configured to sample the value of the transition signal at a time corresponding to an edge of the delayed reference clock signal to generate the output signal from the TDC.

In an embodiment, the slope generation circuit includes a first buffer configured to provide a current according to the input clock signal, a resistor having a first end coupled to an output of the first buffer to receive the current and a second end coupled to a first output node to transmit the received current, and a first capacitor having a first end coupled to the first output node to receive the transmitted current and a second end coupled to a ground, the first capacitor being charged to generate the transition signal at the first output node. The ADC includes a switching element configured to couple the first output node to a second output node in response to the delayed reference clock signal and a second capacitor having a first end coupled to the second output node and a second end coupled to the ground.

In an embodiment, the TDC includes a buffer configured to provide a current according to the delayed reference clock signal, a resistor having a first end coupled to an output of the buffer to receive the current, a capacitor having a first end and a second end, the first end being coupled to an output node, the second end being coupled to a ground, and a switching element configured to couple a second end of the resistor to the first end of the capacitor in response to the delayed reference clock signal to cause the current flowing through the resistor to charge the capacitor to generate the transition signal at the output node.

In an embodiment, the DTC includes a first transistor, a second transistor having a source coupled to a ground, a first resistor having a first end coupled to a drain of the first transistor and a second end coupled to a drain of the second transistor, a first capacitor bank coupled to the first end of the first resistor and configured to adjust a first capacitance value according to the delay control signal, and a capacitor having a first end coupled to the first end of the first resistor and a second end coupled to the ground.

In an embodiment, the DTC further includes a third transistor, a fourth transition having a source coupled to the ground, a second resistor having a first end coupled to a drain of the third transistor and a second end coupled to a drain of the fourth transistor, and a second capacitor bank coupled to the first end of the second resistor and configured to adjust a second capacitance value according to a complementary version of the delay control signal.

In an embodiment, the DPLL circuit further includes a loop filter configured to remove a high frequency component of the output signal from the TDC. The loop filter includes a proportional path and an integral path, the proportional path and the integral path operating in parallel.

In an embodiment, the DPLL circuit further includes a digitally controlled oscillator (DCO) configured to generate a DCO clock signal according to an output signal of the loop filter, a controller including a delta-sigma modulator, the controller being configured to generate the delay control signal and a divider control signal according to an output sequence from the delta-sigma modulator, and a frequency divider configured to divide a frequency of the DCO clock signal according to the divider control signal to generate a divided clock signal, the divided clock signal corresponding to the input clock signal.

In an embodiment, the controller further includes an accumulator configured to accumulate quantization errors of the delta-sigma modulator, a gain correction circuit configured to generate a gain correction factor according to the output signal from the TDC and the quantization errors, and a multiplier configured to multiply an accumulated value of the quantization errors with the gain correction factor to generate the delay control signal.

In an embodiment, the DPLL circuit further includes a digitally controlled oscillator (DCO) configured to generate a DCO clock signal according to the output signal from the TDC, the DCO clock signal being the input clock signal and having a frequency higher than a frequency of the delayed reference clock signal, the input clock signal including a portion corresponding to the transition signal, and a controller including a delta-sigma modulator, the controller being configured to generate the delay control signal according to an output sequence from the delta-sigma modulator.

In an embodiment, the DPLL circuit further includes a frequency adjuster configured to measure a frequency of the reference clock signal and a frequency of the DCO clock signal and adjust the frequency of the DCO clock to be substantially equal to a target frequency.

In an embodiment, the controller further includes an accumulator configured to accumulate quantization errors of the delta-sigma modulator, a gain correction circuit configured to generate a gain correction factor according to the output signal from the TDC and the quantization errors, and a multiplier configured to multiply an accumulated value of the quantization errors with the gain correction factor to generate the delay control signal.

In an embodiment, a method of controlling a digital phase locked loop (DPLL) includes delaying a reference clock signal according to a delay control signal, sampling a value of a transition signal according to the delayed reference clock signal and generating an output signal indicating a phase difference between the delayed clock signal and an input clock signal, the transition signal transitioning between a logic high value and a logic low value. The method further includes generating a digitally controlled oscillator (DCO) clock signal according to the output signal.

In an embodiment, the method further includes generating the delay control signal and a divider control signal according to an output sequence from a delta-sigma modulator, dividing a frequency of the DCO clock signal according to the divider control signal to output the input clock signal, and canceling out a first phase error in the delayed reference clock signal and a second phase error in the input clock signal to substantially remove a phase error in the DCO clock signal due to quantization errors of the delta-sigma modulator, the first phase error and the second phase error being associated with the quantization errors of the delta-sigma modulator.

In an embodiment, the method further includes generating the transition signal according to the input clock signal. Sampling the value of the transition signal includes sampling at a time corresponding to an edge of the delayed reference clock signal.

In an embodiment, the method further includes causing a current to flow through a resistor to charge a first capacitor to generate the transition signal according to the input clock signal and coupling a first end of the first capacitor to an end of a second capacitor to sample the value of the transition signal in response to the delayed reference clock signal, a second end of the first capacitor being connected to a ground.

In an embodiment, the method further includes providing a current to a resistor according to the input clock signal and coupling the resistor to a first end of a capacitor to sample the value of the transition signal in response to the delayed reference clock signal, a second end of the capacitor being coupled to a ground.

In an embodiment, the DCO clock signal is the input clock signal and has a frequency higher than a frequency of the delayed reference clock signal, and the input clock signal includes a portion corresponding to the transition signal. The method further includes generating the delay control signal according to an output sequence from a delta-sigma modulator.

In an embodiment, the method further includes measuring a frequency of the reference clock signal and the frequency of the DCO clock signal and adjusting the frequency of the DCO clock signal to be substantially equal to a target frequency according to the measured frequency of the reference clock signal and the measured frequency of the DCO clock signal.

DETAILED DESCRIPTION

Figure 1:
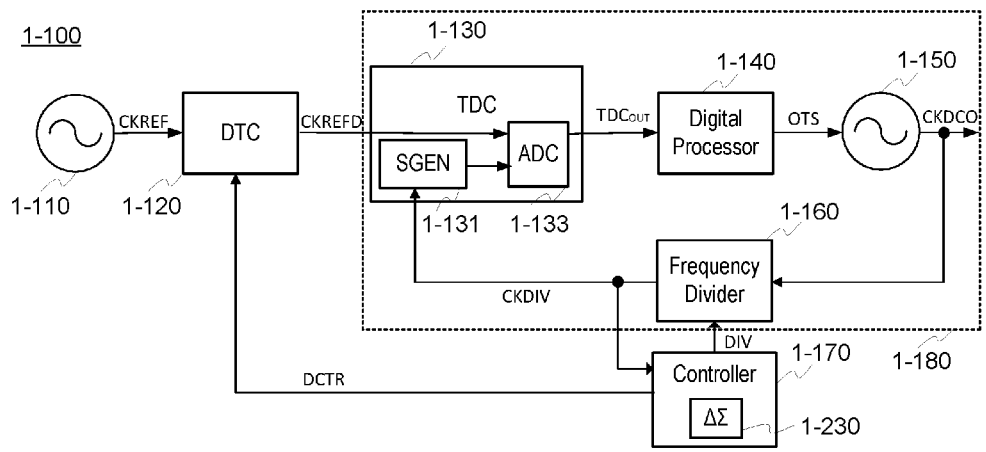
FIG. 1 is a block diagram of an ADPLL, according to an embodiment.

FIG. 1 is a block diagram of an ADPLL circuit 1-100 according to an embodiment. The ADPLL 1-100 of FIG. 1 includes a reference oscillator 1-110, a digital-to-time-converter (DTC) 1-120, a time-to-digital converter (TDC) 1-130, a digital processor 1-140, a digitally controlled oscillator (DCO) 1-150, a frequency divider 1-160, and a controller 1-170.

The reference oscillator 1-110 generates a reference clock signal CKREF. The DTC 1-120 delays the reference clock signal CKREF according to a digital delay control signal DCTR and outputs a delayed reference clock signal CKREFD to a feedback loop 1-180.

The feedback loop 1-180, which includes the TDC 1-130, the digital processor 1-140, the DCO 1-150, and the frequency divider 1-160, generates a divided clock signal CKDIV having a frequency $f_{CKDIV}$ and a DCO clock signal CKDCO having a frequency $f_{CKDCO}$. The frequency $f_{CKDCO}$ of the DCO clock signal CKDCO is represented by Equation 1:

$$f_{CKDCO} = f_{CKDIV} * (N_{int} + K_{frac})$$ Equation 1.

In Equation 1, $N_{int}$ and $K_{frac}$ are an integer value and a fractional value of a target dividing factor of the frequency divider 1-160, respectively.

The frequency divider 1-160 divides the DCO clock signal CKDCO to generate the divided clocks signal CKDIV. In an embodiment, the frequency divider 1-160 is a multi-modulus frequency divider that has a plurality of dividing factors. For example, when the frequency divider 1-160 has first and second dividing factors, the frequency divider 1-160 selects the first dividing factor and the second dividing factor during a first portion and a second portion of a predetermined time interval, respectively, according to a divider control signal DIV. The frequency divider 1-160 divides the frequency of the DCO clock signal CKDCO by the first dividing factor during the first portion of the time interval and by the second dividing factor during the second portion of the time interval. By controlling the relative durations of the first and second portions using the divider control signal DIV, a frequency division produced using the first and second dividing factors over the time interval is substantially equal to the target dividing factor, the target dividing factor being between the first dividing factor and the second dividing factor.

The controller 1-170 generates the divider control signal DIV and the digital delay control signal DCTR according to the divided clock signal CKDIV and the target dividing factor. In an embodiment, the controller 1-170 includes a delta-sigma modulator 1-230, and the controller 1-170 uses an output sequence from the delta-sigma modulator 1-230 to generate the digital delay control signal DCTR and the divider control signal DIV, as will be described in more detail below with reference to FIG. 2. In this embodiment, the frequency divider 1-160 uses the divider control signal DIV to generate the divided clock signal CKDIV, and as a result a quantization error of the delta-sigma modulator 1-230 introduces a phase error in the divided clock signal CKDIV. If the phase error in the divided clock signal CKDIV is not removed, the phase error propagates through the TDC 1-130, the digital processor 1-140, and the DCO 1-150, and would cause a phase error in the DCO clock signal CKDCO.

In order to substantially remove the phase error in the divided clock signal CKDIV, the DTC 1-120 delays the reference clock signal CKREF by a time corresponding to the digital delay control signal DCTR and outputs the delayed reference clock signal CKREFD. Specifically, the delayed reference clock signal CKREFD includes a phase error that is substantially the same as the phase error in the divided clock signal CKDIV resulting from the quantization error of the delta-sigma modulator 1-230, leading to canceling out the phase error in the delayed reference clock signal CKREFD and the phase error in the divided clock signal CKDIV. As a result, a phase error component of the DCO output clock CKDCO of the ADPLL 1-100 resulting from the quantization error of the delta-sigma modulator 1-230 is substantially removed. In addition, a phase difference in time between the delayed clock signal CKREFD and the divided clock signal CKDIV becomes shorter than a phase difference in time between the reference clock signal CKREF and the divided clock signal CKDIV, for example, less than 25 ps or 10 ps.

The TDC 1-130 receives the delayed clock signal CKREFD and the divided clock signal (or an input clock signal) CKDIV and generates a digital output signal $TDC_{OUT}$. The digital output signal $TDC_{OUT}$ corresponds to the phase difference between the delayed clock signal CKREFD and the divided clock signal CKDIV. In an embodiment, the TDC 1-130 includes a slope generation circuit (SGEN) 1-131 and an analog-to-digital converter (ADC) 1-133. The SGEN 1-131 generates an analog signal (or a transition signal) that changes between a logic low value and a logic high value during a predetermined time interval and provides the analog signal to the ADC 1-133. The ADC 1-133 samples a value of the analog signal from the SGEN 1-131 at a time corresponding to an edge of the delayed reference clock signal CKREFD and converts the sampled value into the digital output signal $TDC_{OUT}$.

Because the phase difference between the delayed clock signal CKREFD and the divided clock signal CKDIV is short, the time interval of the SGEN 1-131 used to sample the phase difference is also short, for example, less than 25 ps or 10 ps. Because the analog signal of the SGEN 1-131 changes its value in a given range over such a short time interval, the analog signal of the SGEN 1-131 changes with a steep slope.

For example, in an embodiment, the analog signal increases from 0V to 1V over the time interval equal to 100 ps, the slope is equal to 10 GV/s. Because a time resolution of the TDC 1-130 is a ratio of the time interval over a number of bits of the ADC 1-133, the short time interval results in a fine resolution of the TDC 1-130. For example, when the ADC 1-133 is an 8-bit ADC having a 1V range, the time resolution of the TDC 1-130 is substantially equal to 400 fs. Such a fine resolution of the TDC 1-130 reduces a noise component due to a quantization error of the TDC 1-130, and thus reduces an overall phase noise in the DCO output clock signal CKDCO corresponding to an output clock signal of the ADPLL 1-100.

The digital processor 1-140 removes high frequency components of the digital output signal $TDC_{OUT}$ and outputs an oscillator tuning signal OTS to the DCO 1-150. In an embodiment, the digital processor 1-140 includes an integral path that causes an average value of the digital output signal $TDC_{OUT}$ to be zero in a lock state, and thus a response of the TDC 1-130 remains substantially linear, as will be described below in more detail with reference to FIG. 6.

The DCO 1-150 performs a digital-to-frequency conversion on the oscillator tuning signal OTS to generate the DCO clock signal CKDCO. The DCO clock signal CKDCO is a periodic waveform with the frequency $f_{CKDCO}$, which is a function of the oscillator tuning signal OTS.

Figure 2:
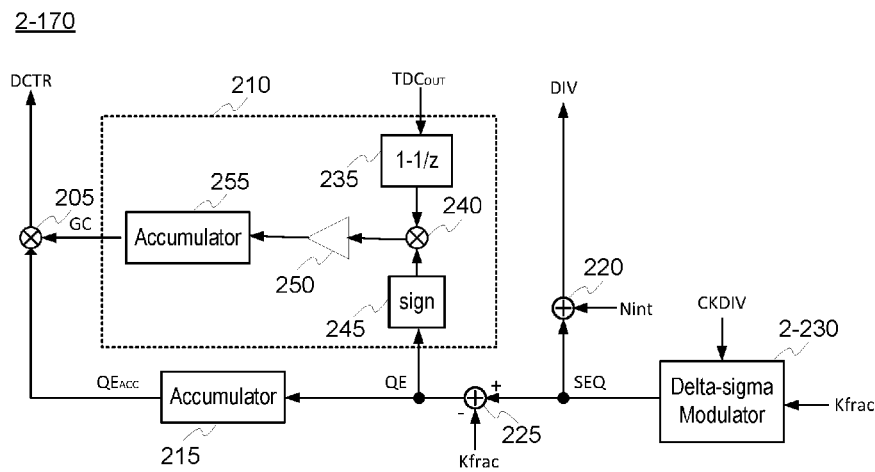
FIG. 2 is a block diagram of a controller of the ADPLL of FIG. 1, according to an embodiment.

FIG. 2 is a block diagram of a controller 2-170 suitable for use as the controller 1-170 of FIG. 1 according to an embodiment. The controller 2-170 of FIG. 2 includes a delta-sigma modulator 2-230, an adder 220, a subtractor 225, an accumulator (or a first accumulator) 215, a gain calibration circuit (or a gain correction circuit) 210, and a multiplier (or a first multiplier) 205.

The delta-sigma modulator 2-230 receives a fractional value $K_{frac}$ of a target dividing factor of a frequency divider (e.g., the frequency divider 1-160 of FIG. 1) and a divided clock signal CKDIV (e.g., the divided clock signal CKDIV of FIG. 1). Based on the received fraction value $K_{frac}$ and the divided clock signal CKDIV, the delta-sigma modulator 2-230 generates a sequence SEQ such that an average value of the sequence SEQ is substantially equal to the fractional value $K_{frac}$. In an embodiment, the delta-sigma modulator 2-230 is a second-order Multi-stAge noise SHaping (MASH) modulator that generates a binary sequence. In another embodiment, the delta-sigma modulator 2-230 is a first-order MASH modulator or a third-order MASH modulator.

The adder 220 adds an integer value Nint of the target dividing factor to a value of the sequence SEQ, in order to provide a divider control signal DIV to the frequency divider. The frequency divider selects one of a plurality of dividing factors corresponding to a value of the divider control signal DIV, and divides a frequency of an output clock signal (e.g., the DCO clock signal CKDCO of FIG. 1) from a DCO (e.g., the DCO 1-150 of FIG. 1) by the selected dividing factor to output the divided clock signal CKDIV.

The subtractor 225 subtracts the fractional value $K_{frac}$ from the value of the sequence SEQ, in order to provide a quantization error signal QE to the accumulator 215 and the gain calibration circuit 210. A value of the quantization error signal QE indicates an instantaneous error incurred by the sequence SEQ in approximating the fractional value $K_{frac}$.

A value of the quantization error signal QE is updated at a rate corresponding to the frequency of the divided clock signal CKDIV, and a value of a digital delay control signal DCTR indicates a delay time of a DTC (e.g., the DTC 1-120 of FIG. 1) corresponding to a phase delay of a reference clock signal (e.g., the reference clock signal CKREF of FIG. 1). Thus, values of the quantization error signal QE in a frequency domain are converted into values in a phase domain, and then the converted values are scaled to corresponding values of the digital delay control signal DCTR.

To convert the values of the quantization error signal QE in the frequency domain into values of an accumulated quantization error signal $QE_{ACC}$ in the phase domain, the accumulator 215 accumulates the values of the quantization error signal QE to output the accumulated quantization error signal $QE_{ACC}$. To scale the values of the accumulated quantization error signal $QE_{ACC}$ to the corresponding values of the digital delay control signal DCTR, the multiplier 205 multiplies the values of the accumulated quantization error signal $QE_{ACC}$ with a gain correction factor GC. In an embodiment, the gain correction factor GC has a value corresponding to a ratio of a period of the output clock signal (e.g., the DCO clock signal CKDCO of FIG. 1) over a DTC resolution in time, which is an amount of an incremental delay in time per least significant bit (LSB) of the digital delay control signal DCTR.

The gain calibration circuit 210 receives an output signal $TDC_{OUT}$ from a TDC (e.g., the TDC 1-130 of FIG. 1) and generates the gain correction factor GC. The gain correction calibration 210 performs a DTC gain calibration on the fly by minimizing a correlation between the output signal $TDC_{OUT}$ of the TDC and a noise in the quantization error signal QE based on the least-mean-square (LMS) algorithm.

In an embodiment, the gain calibration circuit 210 includes a differentiator 235, a sign extractor 245, a second multiplier 240, a gain stage 250, and a second accumulator 255. The differentiator 235 generates differentiated values of the output signal $TDC_{OUT}$, and the sign extractor 245 extracts signs of corresponding values of the quantization error signal QE. The second multiplier 240 multiplies the differentiated values with the extracted signs, the gain stage 250 scales the multiplied values according to a gain value, and the second accumulator 255 accumulates the scaled values to output the gain correction factor GC. The gain calibration circuit 210 operates such that, when a gain error of the DTC, which varies with at least one of a time, a temperature, and a process, causes a ripple in the output signal $TDC_{OUT}$, the value of the gain correction factor GC converges towards an optimal DTC gain value that substantially remove the ripple in the output signal $TDC_{OUT}$.

Figure 3:
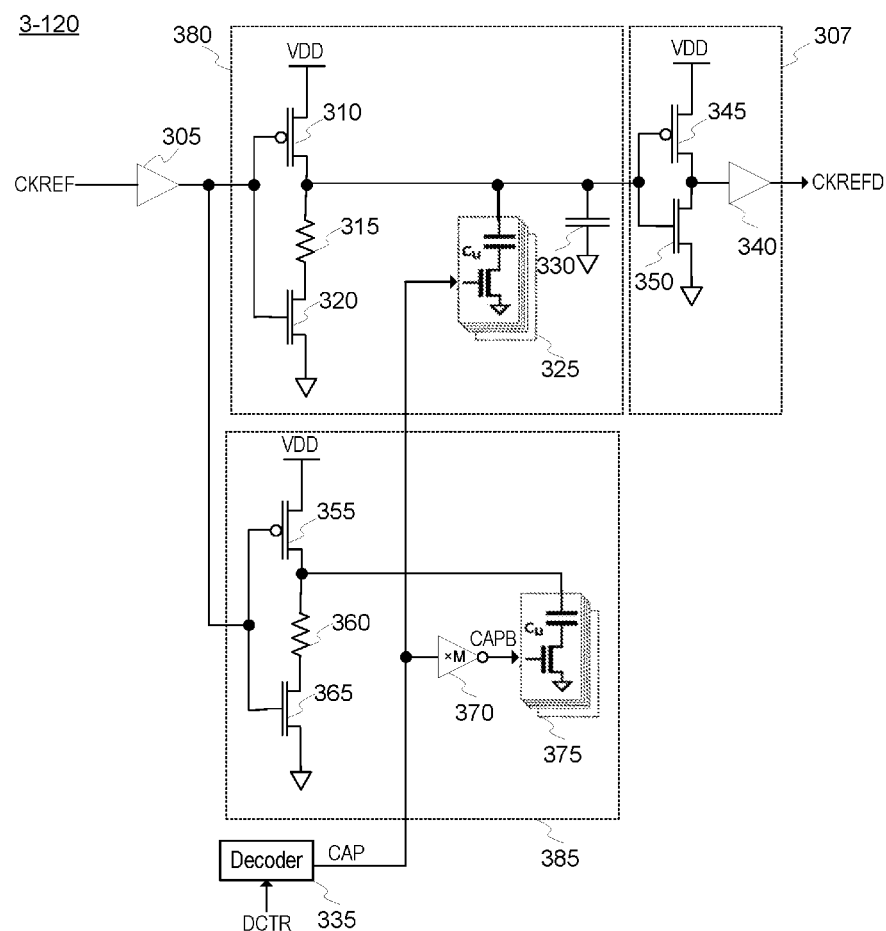
FIG. 3 is a circuit diagram of a DTC of the ADPLL of FIG. 1, according to an embodiment.

FIG. 3 is a circuit diagram of a DTC 3-120 suitable for use as the DTC 1-120 of FIG. 1 according to an embodiment. The DTC 3-120 seen in FIG. 3 includes a first buffer 305, a first delay control circuit 380, a second delay control circuit 385, a second buffer 307, and a decoder 335.

The first buffer 305 receives a reference clock signal CKREF from an oscillator (e.g., the reference oscillator 1-110 of FIG. 1) and serves as an input buffer for the first and second delay control circuits 380 and 385. That is, the first buffer 305 drives the first and second delay control circuits 380 and 385 that are loaded with first and second capacitor banks 325 and 375, respectively.

The first delay control circuit 380 includes a first p-channel metal-oxide semiconductor (PMOS) transistor 310, a first resistor 315, a first n-channel metal-oxide semiconductor (NMOS) transistor 320, the first capacitor bank 325, and a capacitor 330. A gate of the first PMOS transistor 310 and a gate of the first NMOS transistor 320 are connected to an output of the first buffer 305. A source of the first PMOS transistor 310 is connected to a supply voltage VDD and a source of the first NMOS transistor 320 is connected to a ground. First and second ends of the first resistor 315 are connected to a drain of the first PMOS transistor 310 and a drain of the first NMOS transistor 320, respectively.

The first end of the first resistor 315 is connected to first ends of a plurality of capacitors included in the first capacitor bank 325. The first capacitor bank 325 has a capacitance value that varies according to a value of a capacitance control signal CAP, as will be described below in more detail with reference to FIG. 4. Each of the plurality of capacitors in the first capacitor bank 325 is connected to a switching element in series. The switching element has first and second conductive terminals that are connected to the capacitor and the ground, respectively, and has a control terminal that is connected to an output of the decoder 335.

In an embodiment, the first capacitor bank 325 includes 1023 capacitors and their corresponding switching elements. In an embodiment, the capacitance control signal CAP includes a signal for each of the capacitors included in the first capacitor bank 325.

The decoder 335 receives the digital delay control signal DCTR and generates the capacitance control signal CAP. In an embodiment, the capacitance control signal CAP includes a plurality of signals respectively applied to a plurality of control terminals of the switching elements in the first capacitor bank 325.

The capacitor 330 has a first end that is connected to the first ends of the plurality of capacitors in the first capacitor bank 325 and a second end connected to the ground. In an embodiment, the capacitor 330 has a substantially constant capacitance value, for example, 2 pF.

The second buffer 307 includes a second PMOS transistor 345, a second NMOS transistor 350, and an output buffer 340. A gate of the second PMOS transistor 345 and a gate of the second NMOS transistor 350 are connected to the first end of the capacitor 330. A source of the second PMOS transistor 345 is connected to the supply voltage VDD and a source of the second NMOS transistor 350 is connected to the ground. An input of the output buffer 340 is connected to a drain of the second PMOS transistor 345 and a drain of the second NMOS transistor 350. The output buffer 340 transmits a delayed reference clock signal CKREFD to a TDC (e.g., the TDC 1-130 of FIG. 1).

The second delay control circuit 385 includes a third PMOS transistor 355, a second resistor 360, and a third NMOS transistor 365. A gate of the third PMOS transistor 355 and a gate of the third NMOS transistor 365 are connected to the output of the first buffer 305. A source of the third PMOS transistor 355 is connected to the supply voltage VDD and a source of the third NMOS transistor 365 is connected to the ground. First and second ends of the second resistor 360 are connected between a drain of the third PMOS transistor 355 and a drain of the third NMOS transistor 365, respectively.

The first end of the second resistor 360 is connected to first ends of a plurality of capacitors included in the second capacitor bank 375. The second capacitor bank 375 has a capacitance value that varies according to a value of a complementary signal CAPB of the capacitance control signal CAP produced using a plurality of inverters 370. In an embodiment, the plurality inverters 370 include M inverters, wherein M is equal to a number of capacitors in the second capacitor bank 375. In an embodiment, the number of capacitors in the second capacitor bank 375 is equal to a number of capacitors in the first capacitor bank 325.

Each of the plurality of capacitors in the second capacitor bank 375 is connected to a switching element in series. The switching element has first and second conductive terminals that are connected to the capacitor and the ground, respectively, and has a control terminal that is connected to an output of an inverter of the plurality of inverters 370.

Figure 4:
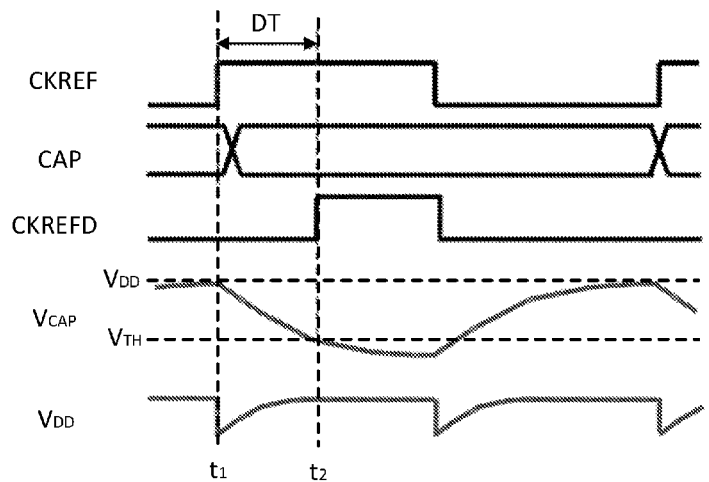
FIG. 4 illustrates an operation of the DTC of FIG. 3, according to an embodiment.

An operation of the DTC 3-120 to output the delayed reference clock signal CKREFD will be described below in detail with reference to FIG. 4.

Prior to a first time t1, the reference clock signal CKREF has a first logic value (e.g., a logic low value) and the first PMOS transistor 310 is turned on to couple the supply voltage $V_{DD}$ to the first ends of the capacitors in the first capacitor bank 325. As a result, all the capacitors in the first capacitor bank 325 are charged such that the first ends of the capacitors respectively have a voltage $V_{CAP}$ substantially equal to the supply voltage $V_{DD}$.

At the first time t1, the reference clock signal CKREF transitions from the first logic value (e.g., a logic low value) to a second logic value (e.g., a logic high value). Thus, the first NMOS transistor 320 is turned on to couple the first ends of the capacitors in the first capacitor bank 325 to the ground. The capacitance control signal CAP is applied to the first capacitor bank 325, and thus turns on a number of switching elements corresponding to a value of the capacitance control signal CAP. The turned on switching elements in the first capacitor bank 325, which are connected to second ends of corresponding capacitors in series, respectively, couple the second ends of the capacitors to the ground. Thus, the coupled capacitors in the first capacitor bank 325 are discharged such that the voltage $V_{CAP}$ at first ends of the coupled capacitors decreases exponentially. The remaining capacitors in the first capacitor bank 325, that is, the capacitors in the first capacitor bank 325 having respective switching elements that are not turned on, float such that their respective capacitances do not affect the rate of the decrease of the voltage $V_{CAP}$, and voltages at first ends of the remaining capacitors remain substantially equal to the voltage $V_{CAP}$.

During a delay interval DT between the first time t1 and a second time t2, the voltage $V_{CAP}$ decreases according to a RC time constant until it reaches a predetermined threshold voltage $V_{TH}$ (e.g., 50% of the supply voltage $V_{DD}$). When the threshold voltage $V_{TH}$ is equal to $0.5*V_{DD}$, the delay interval DT is represented by Equation 1:

$$DT = R*(C_{CB} + C_{CON})*\ln 2 = R*(C_{LSB}*DCTR[N-1:0] + C_{CON})*\ln 2 \quad \text{Equation 1.}$$

In Equation 1, R is a resistance value of the first resistor 315, $C_{CB}$ is a total capacitance value of the first capacitor bank 325, $C_{CON}$ is a capacitance value of the capacitor 330, $C_{LSB}$ is a capacitance value of each of the capacitors in the first capacitor bank 325, and DCTR[N-1:0] is an N-bit value of a digital delay control signal DCTR, wherein the number of turned on switching elements in the first capacitor bank 325 is equal to DCTR[N-1:0].

As shown in Equation 1, the delay interval DT linearly varies with the value DCTR[N-1:0] of the digital delay control signal DCTR. In an embodiment, some of the capacitors in the first capacitor bank 325 are controlled using binary/thermometric partitioning to ease routing of control lines coupled to the controlled capacitors while reducing mismatch errors between the capacitors in the first capacitor bank 325, and thus improving the linear characteristic of the delay interval DT according to the value DCTR[N-1:0] of the digital delay control signal DCTR.

At the second time t2, the second buffer 307, which includes the second PMOS and NMOS transistors 345 and 350, serves as a comparator to toggle the delayed reference clock signal CDREFD having a sharp transition. This toggling time t2 occurs after a propagation delay of the second buffer 307, which depends to some extent on an input slope shape (i.e., the shape of the profile of the voltage $V_{CAP}$), and thus depends on the RC time constant. Because the RC time constant varies with the value DCTR[N-1:0] of the digital delay control signal DCTR, a change in the value DCTR[N-1:0] leads to a variation in the propagation delay of the second buffer 307. Such a variation in the propagation delay degrades the linearity of the DTC 3-120.

However, due to the presence of the capacitor 330 that has a constant capacitance value $C_{con}$, a change in the value DCTR[N-1:0] leads to a reduced variation in the RC time constant compared to when the capacitor 330 is omitted in the first delay control circuit 380. Thus, a variation in the propagation delay of the second buffer 307 is also reduced. In an embodiment, when the total capacitance value $C_{CB}$ of the first capacitor bank 325 is in a range from 2 pF to 3 pF, the capacitance value $C_{con}$ of the capacitor 330 is substantially equal to 2 pF.

Moreover, a ripple of the supply voltage $V_{DD}$ occurring at the first time t1, which depends on the value DCTR[N-1:0] of the digital delay control signal DCTR, causes an additional variation in the propagation delay of the second buffer 307. In order to reduce the additional variation, the second delay control circuit 385 includes the second capacitor bank 375. The second capacitor bank 375 has substantially the same configuration as the first capacitor bank 325, while receiving the complementary signal CAPB of the capacitance control signal CAP. As a result, the combined total number of capacitors in the first and second capacitor banks 325 and 372 that have respective turned on switching elements is a constant regardless of the value of the capacitance control signal CAP. This maintains a total amount of capacitance being charged in the DTC 3-120 at a constant value, which reduces the dependence of the ripple of the supply voltage VDD on the value DCTR[N-1:0] of the digital delay control signal DCTR.

Figure 5A:
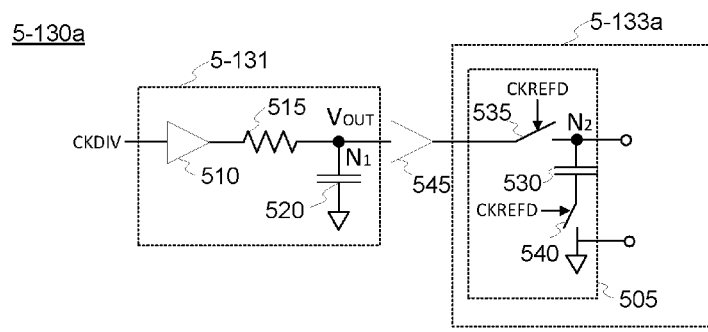
FIG. 5A is a circuit diagram of a TDC of the ADPLL of FIG. 1 including a sampling circuit, according to an embodiment.

FIG. 5A is a circuit diagram of a TDC 5-130a suitable for use as the TDC 1-130 of FIG. 1 according to an embodiment. The TDC 5-130a seen in FIG. 5A includes a slope generation circuit 5-131 and an ADC 5-133a.

The slope generation circuit 5-131 receives a divided clock signal CKDIV (e.g., the divided clock signal CKDIV of FIG. 1) from a frequency divider (e.g., the frequency divider 1-160 of FIG. 1) and outputs a voltage $V_{OUT}$ (or a transition signal) at a first node $N_1$. The slope generation circuit 5-131 includes a first buffer 510, a resistor 515, and a first capacitor 520. A first end of the resistor 515 is connected to an output of the first buffer 510, and a second end of the resistor 515 is connected to a first end of the first capacitor 520. The first end of the first capacitor 520 is connected to an input of a second buffer 545 at the first node $N_1$, and a second end of the first capacitor 520 is connected to a ground.

The second buffer 545 receives the voltage $V_{OUT}$ and generates an analog signal that tracks the voltage VOUT to the ADC 5-133a. In an embodiment, the second buffer 545 is a unity-gain buffer and operates to isolate the capacitance of the first capacitor 520 from the input capacitance of the ADC 5-133a.

The ADC 5-133a receives the analog signal from the second buffer 545 and converts the analog signal into a digital signal. The ADC 5-133a includes a sample-and-hold (S/H) circuit 505.

The S/H circuit 505 includes a first switching element 535, the second capacitor 530, and a second switching element 540. A first end of the first switching element 535 is connected to an output of the second buffer 545, and a second end of the first switching element 535 is connected to a first end of the second capacitor 530 at a second node $N_2$. A second end of the second capacitor 530 is connected to a first end of the second switching element 540. A second end of the second switching element 540 is connected to the ground.

An operation of the slope generation circuit 5-131 and the S/H circuit 505 will be described below in detail with reference to FIG. 6.

At a first time t1, the divided clock signal CKDIV transitions from a first logic value (e.g., a logic low value) to a second logic value (e.g., a logic high value). The first buffer 510 supplies a current to charge the first capacitor 520, and thus the voltage $V_{OUT}$ at the first node $N_1$ starts to increase according to a RC time constant of the slope generation circuit 5-131, which is proportional to a resistance value of the resistor 515 and a capacitance value of the first capacitor 520.

At the first time t1 and until a second time t2, the first and second switching elements 535 and 540 are turned on. As a result, the second buffer 545 charges the second capacitor 530 so that a voltage on a second node $N_2$ is equal to the voltage $V_{OUT}$ at the first node $N_1$.

At a second time t2, a delayed reference clock signal CKREFD transitions from the first logic value to the second logic value. In response to the delayed reference clock signal CKREFD, in an embodiment, the first switching element 535 is turned off to hold the sampled level of the voltage $V_{OUT}$ on the second node $N_2$. In an embodiment, the first switching element 535 is turned off while the second switching element 540 remains turned on. The remaining portion of the ADC 5-133a converts the held level of the voltage $V_{OUT}$ on the second node $N_2$ into a corresponding digital value.

At a third time t3, the voltage $V_{OUT}$ at the first node $N_1$ becomes saturated. The voltage $V_{OUT}$ remains substantially constant until the divided clock signal CKDIV transitions from the second logic value to the first logic value.

Figure 5B:
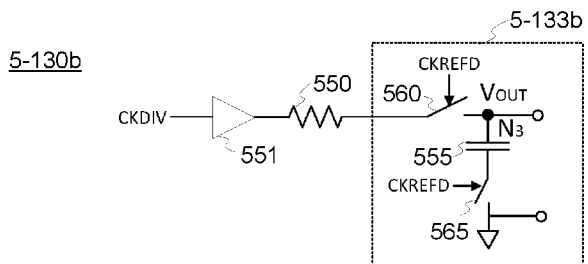
FIG. 5B is a circuit diagram of a TDC of the ADPLL of FIG. 1 including a sampling circuit, according to another embodiment.

FIG. 5B is a circuit diagram of a TDC 5-130b suitable for use as the TDC 1-130 of FIG. 1 according to another embodiment. In the TDC 5-130b of FIG. 5B, the slope generation performed using a distinct capacitor in the TDC 5-130a of FIG. 5A is instead performed using a third capacitor 555 that is also used to perform a sample-and-hold operation of an ADC 5-133b of the TDC 5-130b.

Referring to FIG. 6 again, at the first time t1, the divided clock signal CKDIV transitions from the first logic value to the second logic value. In response to the divided clock signal CKDIV, a third switching element 560 and a fourth switching element 565 are turned on, and a third buffer 551 supplies a current to charge the third capacitor 555 and increase a voltage $V_{OUT}$ at a third node N3 connected to a first end of the third capacitor 555. The voltage $V_{OUT}$ at the third node N3 increases according to an RC time constant, which is proportional to a resistance value of a resistor 550 and a capacitance value of the third capacitor 555.

At the second time t2, in an embodiment, the delayed reference clock signal CKREFD transitions from the first logic value to the second logic value, and the third switching element 560 and the fourth switching element 565 are turned off in response to the delayed reference clock signal CKREFD. In another embodiment, the third switching element 560 is turned off while the fourth switching element 565 remains turned on. Thus, the TDC 5-130b samples and holds the voltage $V_{OUT}$ at the second time t2. The remaining portion (not shown) of the TDC 5-130b converts the sampled level of the voltage $V_{OUT}$ into a corresponding digital value.

The TDC 5-130b is different from the TDC 5-130a of FIG. 5A in that the first capacitor 520 and the second buffer 545 is omitted in the portion of the TDC 5-130b. Thus, power consumption of the TDC 5-130b is reduced compared to the TDC 5-130a. In addition, because the TDC 5-130b includes fewer circuit elements than the TDC 5-130a, the TDC 5-130b is simpler to fabricate than the TDC 5-130a.

Figure 6:
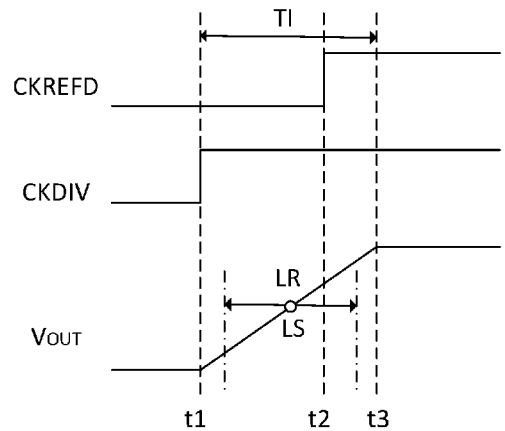
FIG. 6 illustrates an operation of the TDC of FIG. 5A or FIG. 5B, according to an embodiment.

Referring to FIG. 6, during a transition interval TI between the first time t1 and the third time t3, the voltage $V_{OUT}$ increases with a high slope. In an embodiment, the slope is in a range from 10 GV/s to 50 GV/s. For example, the saturated voltage $V_{OUT}$ is 1.05V and the transition interval TI is 100 ps. Because the voltage $V_{OUT}$ has such a high slope, the TDC 5-130a and the TDC 5-130b each have a resolution finer than a conventional TDC based on other topologies, for example, based on a delay chain that includes a plurality of inverters. The finer resolution of the TDC 5-130a and the TDC 5-130b reduces TDC quantization noise, leading to improved performance of an ADPLL (e.g., the ADPLL 1-100 of FIG. 1) that includes the TDC 5-130a or the TDC 5-130b.

Although the voltage $V_{OUT}$ produced by slope generation increases exponentially, a profile of the voltage $V_{OUT}$ in a middle range LR of the transition interval TI is substantially linear. For example, in an embodiment, when the transition interval TI is 100 ps, in the linear range LR from 40 ps to 60 ps, a magnitude of a difference between an actual profile of the voltage $V_{OUT}$ and a linear profile that approximates the actual profile is less than 0.1% of the saturated level (e.g., 1.05V) of the voltage $V_{OUT}$. When the ADPLL including the TDC 5-130a or the TDC 5-130b operates to reach a lock state LS, which corresponds to a middle point of the transition interval TI, the sampled voltage at the second time t2 lies within the linear range LR of the transition interval TI, as will be described in more detail below with reference to FIG. 7.

Figure 7:
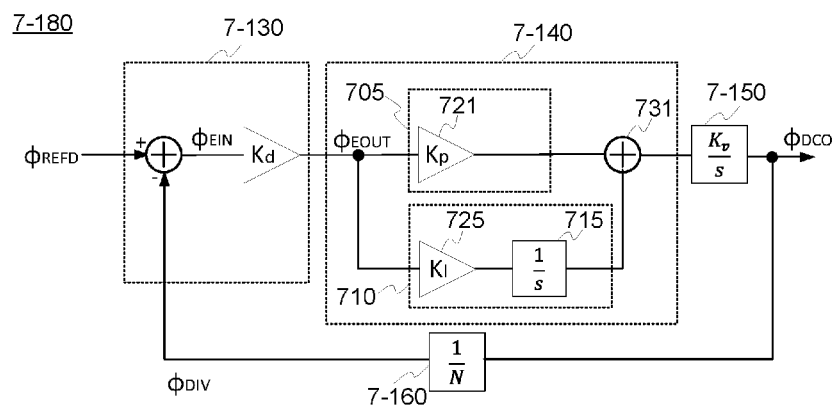
FIG. 7 illustrates a linearized model of a feedback loop of the ADPLL of FIG. 1, according to an embodiment.

FIG. 7 illustrates a linearized model of a feedback loop 7-180 suitable for use as the feedback loop 1-180 of FIG. 1. In the linearized model, input and output variables indicate phases, rather than time waveforms of actual input and output variables shown in FIG. 1.

The feedback loop 7-180 seen in FIG. 7 includes a TDC 7-130, a digital processor 7-140, a DCO 7-150, and a frequency divider 7-160. The TDC 7-130 receives a phase $\phi_{REFD}$ of a delayed reference clock signal (e.g., the delayed reference clock signal CKREFD of FIG. 1) and a phase $\phi_{DIV}$ of a divided clock signal (e.g., the divided clock signal CKDIV of FIG. 1). The TDC 7-130 calculates a phase error $\phi_{EIN}$, which is a difference between the phase $\phi_{REFD}$ of the delayed reference clock signal and the phase $\phi_{DIV}$ of the divided clock signal, and provides an output phase error $\phi_{EOUT}$ to the digital processor 7-140.

The digital processor 7-140 includes a loop filter having a proportional path 705, an integral path 710, and an adder 731. The proportional path 705 includes a proportional buffer 721, and the integral path 710 includes an integral buffer 725 and an integrator 715. The proportional path 705 and the integral paths 710 operate in parallel to provide first and second inputs signals to the adder 731.

An input-to-error transfer function of the feedback loop 7-180 is represented by Equation 2:

$$\frac{\varphi_{EIN}(s)}{\varphi_{REFD}(s)} = \frac{\varphi_{EOUT}(s)/K_d}{\varphi_{REFD}(s)} = \frac{s^2}{s^2 + Ks + \frac{K_I}{K_P}}, K = \frac{K_d K_P K_I}{N}. \quad \text{Equation 2}$$

In Equation 2, $K_d$ is a gain value of the TDC 7-130, $K_P$ is a proportional coefficient of the loop filter 7-140, $K_I$ is an integral coefficient of the loop filter 7-140.

When a frequency step dF occurs on the divided reference clock signal (e.g., the divided clock signal CKDIV of FIG. 1) at the beginning of a PLL locking phase, the Laplace-domain representation of this step response in a phase domain is represented by equation 3.

$$\varphi_{REFD}(s) = \frac{2\pi dF}{s^2}. \quad \text{Equation 3}$$

Accordingly, a steady-state value of the phase error $\phi_{EIN}$ is represented by Equation 4.

$$\lim_{s \to 0} s\varphi_{EIN}(s) = \lim_{s \to 0} s \frac{s^2}{s^2 + Ks + \frac{K_I}{K_P}} \frac{2\pi dF}{s^2} = 0. \quad \text{Equation 4}$$

Because the loop filter 7-140 causes the steady-state value of the phase error $\phi_{EIN}$ to be zero, the difference between the phase $\phi_{REFD}$ of the delayed reference clock signal and the phase $\phi_{DIV}$ of the divided clock signal becomes zero on average. Because the phase error $\phi_{EIN}$ is zero in the steady-state, a frequency error between the delayed reference clock signal and the divided clock signal also becomes zero on average. That is, in the steady-state, an ADPLL that includes the feedback loop 7-180 reaches the lock state LS.

Referring back to FIGS. 5A and 6, in the lock state LS, the phase error $\phi_{EIN}$ input to the TDC 5-130a is zero, and thus the output phase error $\phi_{EOUT}$ corresponding to an output value of the ADC 5-133 is zero. The zero output value of the ADC 5-133 corresponds to the middle point of the transition interval TI, and thus the lock state LS corresponds to the middle point of the transition interval TI. When a phase error $\phi_{EIN}$ between the delayed reference clock signal CKREFD and the divided clock signal CKDIV occurs due to residual quantization noise or other noise sources and the ADPLL operates to recover the lock state LS, a voltage sampled at the second time t2 corresponding to the phase error $\phi_{EIN}$ will lie within the linear range LR including the middle point of the transition interval TI. As a result, a response of the TDC 5-130a remains substantially linear and the exponential behavior of the voltage $V_{OUT}$ outside the linear range LR does not significantly affect the performance of the ADPLL.

Referring back to FIG. 7, in an embodiment, the digital processor 7-140 includes an adder (not shown) coupled to an output of the TDC 7-130 and an input of the loop filter 7-140. Such an adder receives an offset value and adds the offset value to a value of an output signal (e.g., the output signal $TDC_{OUT}$ of FIG. 1) of the TDC 7-130, making the value of the output signal in the lock state LS more proximate to the middle point of the transition interval TI.

Figure 8:
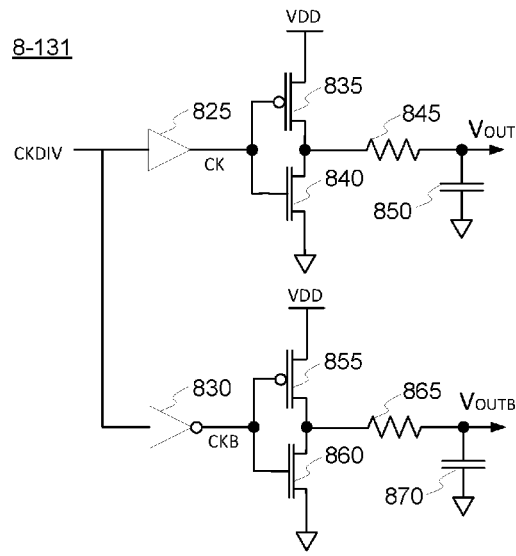
FIG. 8 is a circuit diagram of a slope generation circuit of a TDC of the ADPLL of FIG. 1, according to an embodiment.

FIG. 8 is a circuit diagram of a slope generation circuit 8-131 suitable for use as the slope generation circuit 1-131 of FIG. 1 according to an embodiment.

The slope generation circuit 8-131 seen in FIG. 8 provides differential voltage signals $V_{OUT}$ and $V_{OUTB}$ to an ADC that uses differential voltage inputs. The slope generation circuit 8-131 includes a buffer 825, a first PMOS transistor 835, a first NMOS transistor 840, a first resistor 845, a first capacitor 850, an inverter 830, a second PMOS transistor 855, a second NMOS transistor 860, a second resistor 865, and a second capacitor 870.

In an embodiment, the first PMOS transistor 835, the first NMOS transistor 840, the first resistor 845, and the first capacitor 850 are substantially identical to the second PMOS transistor 855, the second NMOS transistor 860, the second resistor 865, and the second capacitor 870, respectively.

The buffer 825 receives a divided clock signal CKDIV and provides a clock signal CK to gates of the first PMOS and NMOS transistors 835 and 840. The inverter 830 receives the divided clock signal CKDIV and provides a complementary clock signal CKB to gates of the second PMOS and NMOS transistors 855 and 860. The clock signal CK and the complementary clock signal CKB are aligned such that a skew between the clock signals CK and CKB is below a predetermined percentage of a transition interval (e.g., the transition interval TI of FIG. 6) of the voltage signal $V_{OUT}$. In an embodiment, the skew between the clock signals CK and CKB is equal to or less than 2% of the transition interval.

For example, when the divided clock signal has a logic high value, the complementary clock signal CKB has a logic low value to turn on the second PMOS transistor 855 and turn off the second NMOS transistor 860, and thus the voltage $V_{OUTB}$ increases to charge the second capacitor 870 according to an RC time constant, which is determined by a resistance value of the second resistor 865 and a capacitance value of the second capacitor 870. The second PMOS transistor 855 and the second NMOS transistor 860 operate as switching elements, and thus the second PMOS transistor 855 and the second NMOS transistor 860 do not introduce any significant flicker noise.

In an embodiment, the charge storage functions of the first and second capacitors 850 and 870 are instead performed by capacitors in respective sample-and-hold circuits of the ADC, in a manner similar to that shown in FIG. 5B.

Figure 9:
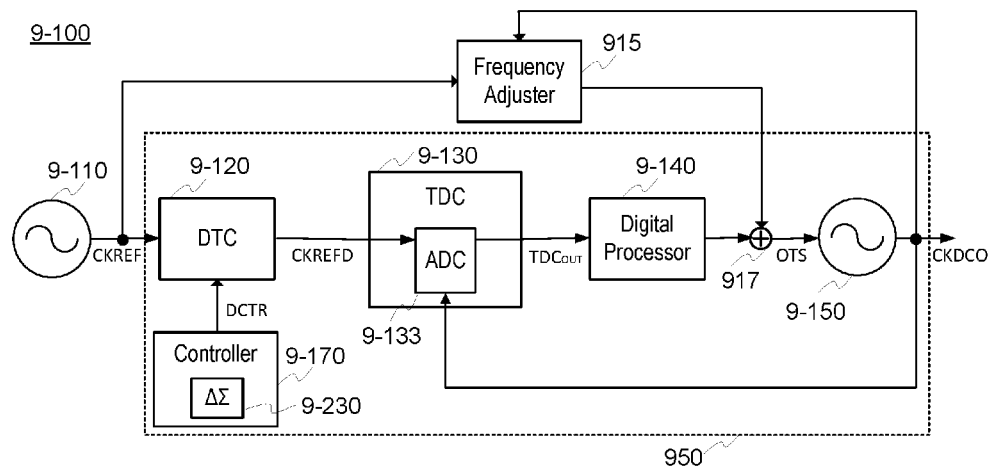
FIG. 9 is a block diagram of an ADPLL, according to another embodiment.

FIG. 9 is a block diagram of an ADPLL 9-100 according to another embodiment. The ADPLL 9-100 includes a reference oscillator 9-110, a DTC 9-120, a TDC 9-130, a digital processor 9-140, a DCO 9-150, a controller 9-170, a frequency adjuster 915, and an adder 917.

The ADPLL 9-100 is different from the ADPLL 1-100 of FIG. 1 in that the frequency divider 1-160 and the slope generation circuit 1-131 of the ADPLL 1-100 are omitted. Thus, the ADC 9-133 of the TDC 9-130 samples a DCO clock signal CKDCO at a time corresponding to an edge of a delayed reference clock signal CKREFD. Because the DCO clock signal CKDCO has a frequency higher than that of the delayed reference clock signal CKREFD, the ADPLL 9-100 performs a subsampling operation.

Operations of the controller 9-170 and the DTC 9-120 are similar to those of the controller 1-170 and the DTC 1-120 of ADPLL 1-100, respectively, as described above with reference to FIG. 1, and thus detailed descriptions of the operations will be omitted herein for the interest of brevity. The controller 9-170 includes a delta-sigma modulator 9-230, and an output sequence of the delta-sigma modulator 9-230 is used to achieve a fractional-N subsampling operation.

However, when a PLL control loop 950, which includes DTC 9-120, the TDC 9-130, the digital processor 9-140, the DCO 9-150, and the controller 9-170, performs the subsampling operation and reaches a lock state, a number of cycles of the DCO clock signal CKDCO included in a single cycle of the delayed reference clock signal CKREFD can be any integer value. This number of cycles of the DCO clock signal CKDCO is desirably equal to an integer value of a frequency multiplication factor to achieve a target frequency of the DCO clock signal CKDCO, where the target frequency is a multiplied value of the frequency multiplication factor and the frequency $f_{CKREFD}$ of the delayed reference clock signal CKREFD. When the number of cycles of the DCO clock signal CKDCO is different from the integer value of the frequency multiplication factor to achieve the target frequency, the frequency $f_{CKDCO}$ of the DCO clock signal CKDCO in the lock state may be different from the target frequency.

In order to achieve the target frequency of the DCO clock signal CKDCO, the ADPLL 9-100 further includes the frequency adjuster 915 that controls the DCO 9-150. In an embodiment, the frequency adjuster 915 measures a frequency $f_{CKDCO}$ of the DCO clock signal CKDCO and a frequency $f_{CKREF}$ of a reference clock signal CKREF, which is substantially equal to the frequency $f_{CKREFD}$ of the delayed reference clock signal CKREFD. According to the measured frequencies $f_{CKREF}$ and $f_{CKDCO}$, the frequency adjuster 915 generates an output signal to control the DCO 9-150 to cause the number of cycles of the DCO clock signal CKDCO included in the single cycle of the delayed reference clock signal CKREFD to be equal to the integer value of the frequency multiplication factor. The adder 917 combines the output signal from the frequency adjuster 915 and an output signal from the digital processor 9-140 to provide the combined signals as an oscillator tuning signal OTS to the DCO 9-150.

Figure 10:
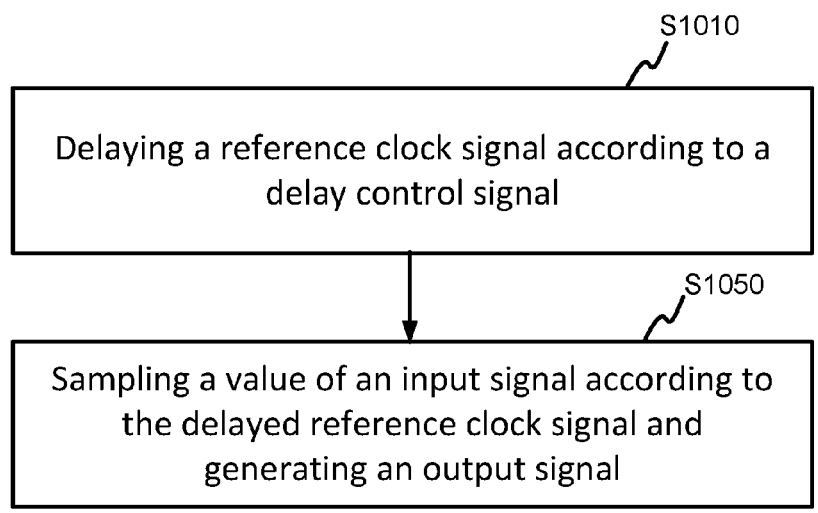
FIG. 10 is a flowchart that illustrates a process performed by the ADPLL of FIG. 1 or the ADPLL of FIG. 9, according to an embodiment.

FIG. 10 is a flowchart that illustrates a process 1000 performed by an ADPLL (e.g., the ADPLL 1-100 of FIG. 1, or the ADPLL 9-100 of FIG. 9) according to an embodiment. The ADPLL includes a digital-to-time converter (DTC) and a time-to-digital converter (TDC).

At S1010, the DTC delays a reference clock signal according to a delay control signal. In an embodiment, the delayed reference clock signal compensates for a first phase error in a divided clock signal resulting from a quantization error of a delta-sigma modulator, such that the first phase error in the divided clock signal is substantially canceled out by a second phase error in the delayed reference clock signal resulting from the quantization error of the delta-sigma modulator.

At S1050, the TDC samples a value of an input signal (or a transition signal) according to the delayed reference clock signal and generates an output signal indicating a phase difference between the delayed clock signal and an input clock signal. The input signal has a transition slope that is greater than a predetermined value, and thus a time resolution of the TDC is improved.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. A digital phase locked loop (DPLL) circuit comprising:
a digital-to-time converter (DTC) configured to generate a delayed reference clock signal by delaying a reference clock signal according to a delay control signal; and
a time-to-digital converter (TDC) coupled to an output of the DTC, the TDC being configured to sample a value of a transition signal according to the delayed reference clock signal and to generate an output signal indicating a phase difference between the delayed clock signal and an input clock signal, the transition signal transitioning between a logic high value and a logic low value.

2. The circuit of claim 1, further comprising:
a controller including a delta-sigma modulator, the controller being configured to generate the delay control signal and a divider control signal according to an output sequence from the delta-sigma modulator; and
a frequency divider configured to divide a frequency of an output clock signal of the DPLL according to the divider control signal to output the input clock signal,
wherein the DTC generates the delayed reference clock signal including a first phase error that is substantially the same as a second phase error in the input clock signal, the first phase error and the second phase error being associated with quantization errors of the delta-sigma modulator.

3. The circuit of claim 1, wherein the TDC includes:
a slope generation circuit configured to generate the transition signal according to the input clock signal; and
an analog-to-digital converter (ADC) configured to sample the value of the transition signal at a time corresponding to an edge of the delayed reference clock signal to generate the output signal from the TDC.

4. The circuit of claim 3, wherein the slope generation circuit includes:
a first buffer configured to provide a current according to the input clock signal;
a resistor having a first end coupled to an output of the first buffer to receive the current and a second end coupled to a first output node to transmit the received current; and
a first capacitor having a first end coupled to the first output node to receive the transmitted current and a second end coupled to a ground, the first capacitor being charged to generate the transition signal at the first output node, and
wherein the ADC includes:
a switching element configured to couple the first output node to a second output node in response to the delayed reference clock signal; and
a second capacitor having a first end coupled to the second output node and a second end coupled to the ground.

5. The circuit of claim 1, wherein the TDC includes:
a buffer configured to provide a current according to the delayed reference clock signal;

a resistor having a first end coupled to an output of the buffer to receive the current;

a capacitor having a first end and a second end, the first end being coupled to an output node, the second end being coupled to a ground; and a switching element configured to couple a second end of the resistor to the first end of the capacitor in response to the delayed reference clock signal to cause the current flowing through the resistor to charge the capacitor to generate the transition signal at the output node.

6. The circuit of claim 1, wherein the DTC includes:
a first transistor;
a second transistor having a source coupled to a ground;
a first resistor having a first end coupled to a drain of the first transistor and a second end coupled to a drain of the second transistor;
a first capacitor bank coupled to the first end of the first resistor and configured to adjust a first capacitance value according to the delay control signal; and
a capacitor having a first end coupled to the first end of the first resistor and a second end coupled to the ground.

7. The circuit of claim 6, wherein the DTC further includes:
a third transistor;
a fourth transition having a source coupled to the ground;
a second resistor having a first end coupled to a drain of the third transistor and a second end coupled to a drain of the fourth transistor; and
a second capacitor bank coupled to the first end of the second resistor and configured to adjust a second capacitance value according to a complementary version of the delay control signal.

8. The circuit of claim 1, further comprising:
a loop filter configured to remove a high frequency component of the output signal from the TDC,
wherein the loop filter includes a proportional path and an integral path, the proportional path and the integral path operating in parallel.

9. The circuit of claim 8, further comprising:
a digitally controlled oscillator (DCO) configured to generate a DCO clock signal according to an output signal of the loop filter;
a controller including a delta-sigma modulator, the controller being configured to generate the delay control signal and a divider control signal according to an output sequence from the delta-sigma modulator; and
a frequency divider configured to divide a frequency of the DCO clock signal according to the divider control signal to generate a divided clock signal, the divided clock signal corresponding to the input clock signal.

10. The circuit of claim 9, wherein the controller further includes:
an accumulator configured to accumulate quantization errors of the delta-sigma modulator;
a gain correction circuit configured to generate a gain correction factor according to the output signal from the TDC and the quantization errors; and
a multiplier configured to multiply an accumulated value of the quantization errors with the gain correction factor to generate the delay control signal.

11. The circuit of claim 1, further comprising:
a digitally controlled oscillator (DCO) configured to generate a DCO clock signal according to the output signal from the TDC, the DCO clock signal being the input clock signal and having a frequency higher than a frequency of the delayed reference clock signal, the input clock signal including a portion corresponding to the transition signal; and
a controller including a delta-sigma modulator, the controller being configured to generate the delay control signal according to an output sequence from the delta-sigma modulator.

12. The circuit of claim 11, further comprising:
a frequency adjuster configured to measure a frequency of the reference clock signal and a frequency of the DCO clock signal and adjust the frequency of the DCO clock to be substantially equal to a target frequency.

13. The circuit of claim 11, wherein the controller further includes:
an accumulator configured to accumulate quantization errors of the delta-sigma modulator;
a gain correction circuit configured to generate a gain correction factor according to the output signal from the TDC and the quantization errors; and
a multiplier configured to multiply an accumulated value of the quantization errors with the gain correction factor to generate the delay control signal.

14. A method of controlling a digital phase locked loop (DPLL) comprising:
delaying a reference clock signal according to a delay control signal;
sampling a value of a transition signal according to the delayed reference clock signal and generating an output signal indicating a phase difference between the delayed clock signal and an input clock signal, the transition signal transitioning between a logic high value and a logic low value; and
generating a digitally controlled oscillator (DCO) clock signal according to the output signal.

15. The method of claim 14, further comprising:
generating the delay control signal and a divider control signal according to an output sequence from a delta-sigma modulator;
dividing a frequency of the DCO clock signal according to the divider control signal to output the input clock signal; and
canceling out a first phase error in the delayed reference clock signal and a second phase error in the input clock signal to substantially remove a phase error in the DCO clock signal due to quantization errors of the delta-sigma modulator, the first phase error and the second phase error being associated with the quantization errors of the delta-sigma modulator.

16. The method of claim 14, further comprising:
generating the transition signal according to the input clock signal,
wherein sampling the value of the transition signal includes sampling at a time corresponding to an edge of the delayed reference clock signal.

17. The method of claim 16, further comprising:
causing a current to flow through a resistor to charge a first capacitor to generate the transition signal according to the input clock signal; and
coupling a first end of the first capacitor to an end of a second capacitor to sample the value of the transition signal in response to the delayed reference clock signal, a second end of the first capacitor being connected to a ground.

18. The method of claim 16, further comprising:
providing a current to a resistor according to the input clock signal; and coupling the resistor to a first end of a capacitor to sample the value of the transition signal in response to the delayed reference clock signal, a second end of the capacitor being coupled to a ground.

19. The method of claim 14, wherein the DCO clock signal is the input clock signal and has a frequency higher than a frequency of the delayed reference clock signal, the input clock signal including a portion corresponding to the transition signal, the method further comprising:
generating the delay control signal according to an output sequence from a delta-sigma modulator.

20. The method of claim 19, further comprising:
measuring a frequency of the reference clock signal and the frequency of the DCO clock signal; and
adjusting the frequency of the DCO clock signal to be substantially equal to a target frequency according to the measured frequency of the reference clock signal and the measured frequency of the DCO clock signal.

* * * * *